United States Patent
Hsu

(10) Patent No.: US 6,236,073 B1
(45) Date of Patent: May 22, 2001

(54) ELECTROSTATIC DISCHARGE DEVICE

(75) Inventor: Chen-Chung Hsu, Hsinchu Hsien (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/294,844

(22) Filed: Apr. 20, 1999

(51) Int. Cl.$^7$ .................................................. H01L 29/76
(52) U.S. Cl. ........................ 257/213; 257/204; 257/365; 257/360; 257/356; 257/355
(58) Field of Search .................................... 438/283, 279; 257/365, 355, 204, 213, 360, 356

(56) References Cited

U.S. PATENT DOCUMENTS

| | | | | |
|---|---|---|---|---|
| 5,519,242 | * | 5/1996 | Avery | 257/356 |
| 5,721,439 | * | 2/1998 | Lin | 257/204 |
| 5,838,033 | * | 11/1998 | Smooha | 257/213 |
| 5,917,220 | * | 6/1999 | Waggoner | 257/360 |
| 6,060,752 | * | 5/2000 | Williams | 257/355 |

* cited by examiner

*Primary Examiner*—Matthew Smith
*Assistant Examiner*—V. Yevsikou
(74) *Attorney, Agent, or Firm*—Martine Penilla & Kim, LLP

(57) ABSTRACT

An electrostatic discharge protective circuit formed on a substrate is described. A gate electrode is formed over the substrate. A drain region is formed in the substrate at one side of the gate electrode. A source region is formed in the substrate at the other side of the gate electrode. A dielectric layer having a drain contact and a source contact formed therein is formed over the substrate, wherein the drain contact is electrically coupled to the drain region and the source contact is electrically coupled to the source region. A plurality of floating polysilicons is formed on the substrate in the dielectric layer between the drain contact and the gate electrode. Since the floating polysilicons are staggered on the substrate in a checkered pattern, the electrostatic discharge transient current path is greatly increased. Therefore, the electricity dissipation length is greatly increased. Hence, the protective efficacy of the electrostatic discharge protective circuit can be improved.

13 Claims, 3 Drawing Sheets

ELECTROSTATIC DISCHARGE DEVICE

BACKGROUND OF THE INVENTION

1. Field of the Invention

The present invention relates to an electrostatic discharge device. More particularly, the present invention relates to an electrostatic discharge device, which can detour the current path and increase the electricity dissipation length.

2. Description of the Related Art

Electrostatic discharge (ESD) is one of the major ways for an integrated circuit (IC) to be damaged in an IC fabrication process. This is especially true for fabrication of a deep sub-micron IC. In order to overcome the problems caused by static electricity, an ESD protective circuit is incorporated onto the input/output (I/O) pads of a complementary metal-oxide-semiconductor (CMOS) IC through an on-chip method.

Since the gate oxide layer becomes thinner as the line width of the semiconductor fabrication process is downsized, the breakdown voltage of the gate oxide layer approaches or is lower than that of the source/drain junction. Hence, the protection provided by the ESD protective circuit becomes less effective. Additionally, design of the inner circuit often follows minimum design rules. Because the inner circuit is not appropriately designed (such as enough spaces for contact-to-diffusion edge and contact-to-gate electrode edge) for resisting the large ESD transient current, the wafer is easily damaged by ESD in highly integrated circuits. Therefore, ESD is one of the major reasons leading to failure in deep sub-micron integrated circuits.

FIG. 1A is a circuit diagram for a conventional ESD protective circuit. As shown in FIG. 1A, in order to protect the internal circuit 10, the ESD current imported through an input port INP is discharged through an NMOS transistor N1 to a ground $V_{SS}$. FIG. 1B is a schematic circuit diagram of another conventional ESD protective circuit. As shown in FIG. 1B, in order to protect the internal circuit 10, the ESD current can be discharged not only through an NMOS transistor N1 to the ground $V_{SS}$ but also through a PMOS transistor P1 to a voltage source $V_{DD}$.

FIG. 2 is a schematic, cross-sectional view of the conventional ESD protective circuit shown in FIG. 1A. As shown in FIG. 2, the NMOS transistor N1 is formed on a substrate 20. The NMOS transistor N1 comprises a drain region 22 formed in the substrate 20, a source region 24 formed in the substrate 20 and a gate electrode 26 formed on the substrate 20 between the source region 24 and the drain region 22. The gate electrode 26 is isolated from the substrate 20 by a gate oxide layer 25. A dielectric layer 28 having a drain contact 30 and a source contact 32 formed therein is formed over the substrate 20, and the drain region 22 is coupled to an input line I/P through the drain contact 30 and the source region 24 is coupled to the ground $V_{SS}$ through the source contact 32.

FIG. 3 is a schematic, top view of the ESD protective circuit in FIG. 2. The cross-sectional view taken along the line I—I in FIG. 3 is denoted as FIG. 2. As shown in FIG. 3, circles with declining lines at the midpoint part denote the source contacts 30 and circles with declining lines at both sides denote the drain contacts 32. The source region 24 and the gate electrode 26 are respectively electrically coupled to the ground $V_{SS}$ (as shown in FIG. 1A or FIG. 1B). The source region 22 is electrically coupled to the input line I/P (as shown in FIG. 1A or FIG. 1B). The ESD transient current $I_1$ flows to the drain region 22 through the drain contact 30 and diffuses in the drain region 22. Then, the ESD transient current $I_1$ flows to the ground $V_{SS}$ through the source contact 32.

However, when the gate electrode is nonuniform, some of the channels open relatively early. Moreover, when some of the channels have defects, the ESD transient current $I_1$ excessively focuses at those channels or at the defects. Therefore, the massive current passes through only a portion of the NMOS transistor N1 and the temperature of that portion of the NMOS transistor N1 is high. Hence, the wafer structure is damaged. Additionally, the efficacy of the ESD protective circuit is poor.

SUMMARY OF THE INVENTION

The invention provides an electrostatic discharge protective circuit. By using the invention, the electrostatic discharge transient current path is greatly increased, so that the electricity dissipation length is increased. Hence, the protective efficacy of the electrostatic discharge protective circuit can be improved.

To achieve these and other advantages and in accordance with the purpose of the invention, as embodied and broadly described herein, the invention provides an electrostatic discharge protective circuit formed on a substrate. A gate electrode is formed over the substrate. A drain region is formed in the substrate at one side of the gate electrode. A source region is formed in the substrate at the other side of the gate electrode. A dielectric layer having a drain contact and a source contact formed therein is formed over the substrate, wherein the drain contact is electrically coupled to the drain region and the source contact is electrically coupled to the source region. A plurality of floating polysilicons is formed on the substrate in the dielectric layer between the drain contact and the gate electrode. Since the floating polysilicons are staggered on the substrate in a checkered pattern, the electrostatic discharge transient current path is greatly increased. Therefore, the electricity dissipation length is greatly increased. Hence, the protective efficacy of the electrostatic discharge protective circuit can be improved.

It is to be understood that both the foregoing general description and the following detailed description are exemplary, and are intended to provide further explanation of the invention as claimed.

BRIEF DESCRIPTION THE DRAWINGS

The accompanying drawings included to provide a further understanding of the invention, and are incorporated in and constitute a part of this specification. The drawings illustrate embodiments of the invention and, together with the description, serve to explain the principles of the invention. In the drawings, FIG. 1A is a circuit diagram for a conventional ESD protective circuit;

DESCRIPTION OF THE PREFERRED EMBODIMENTS

Figure 1A:
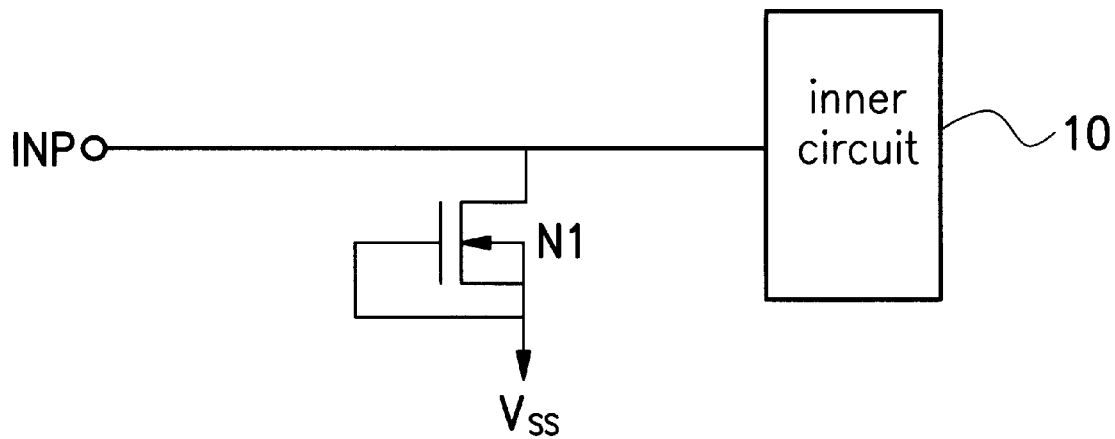
FIG. 1B is a circuit diagram for another conventional ESD protective circuit.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
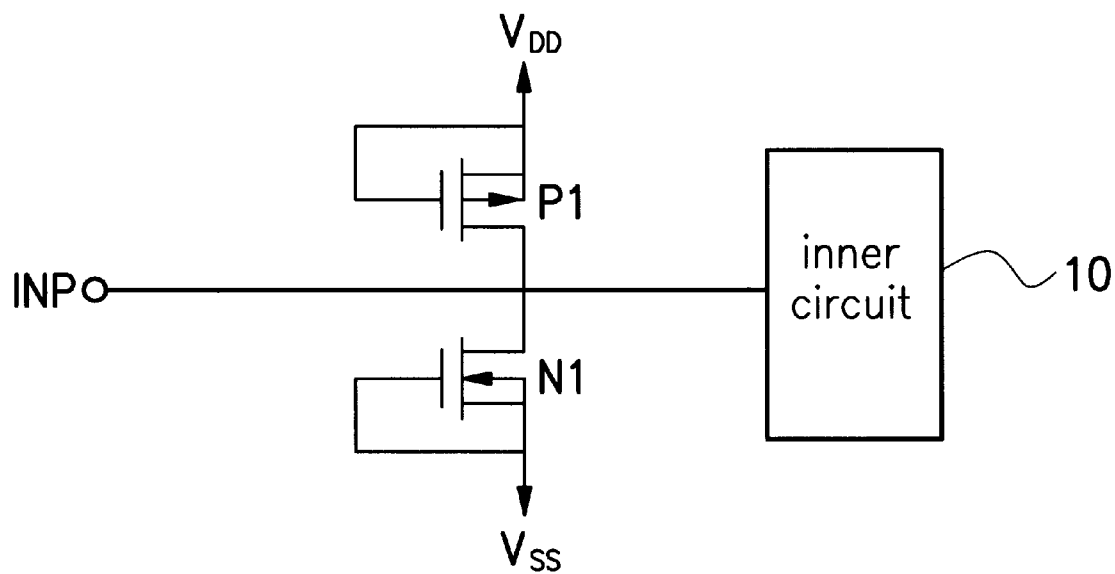
Figure 2:
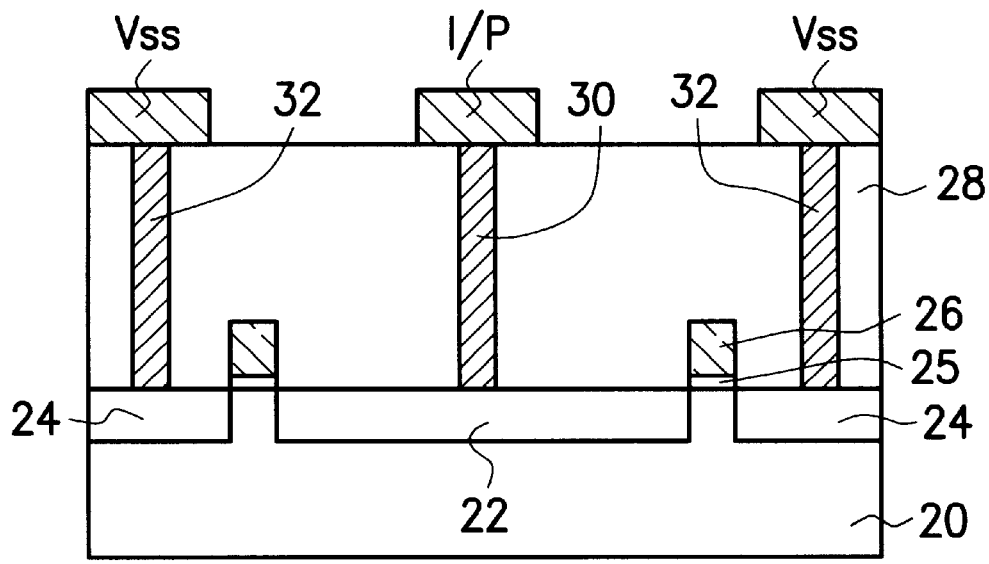
FIG. 2 is a schematic, cross-sectional view of a conventional ESD protective circuit in FIG. 1A.
Figure 3:
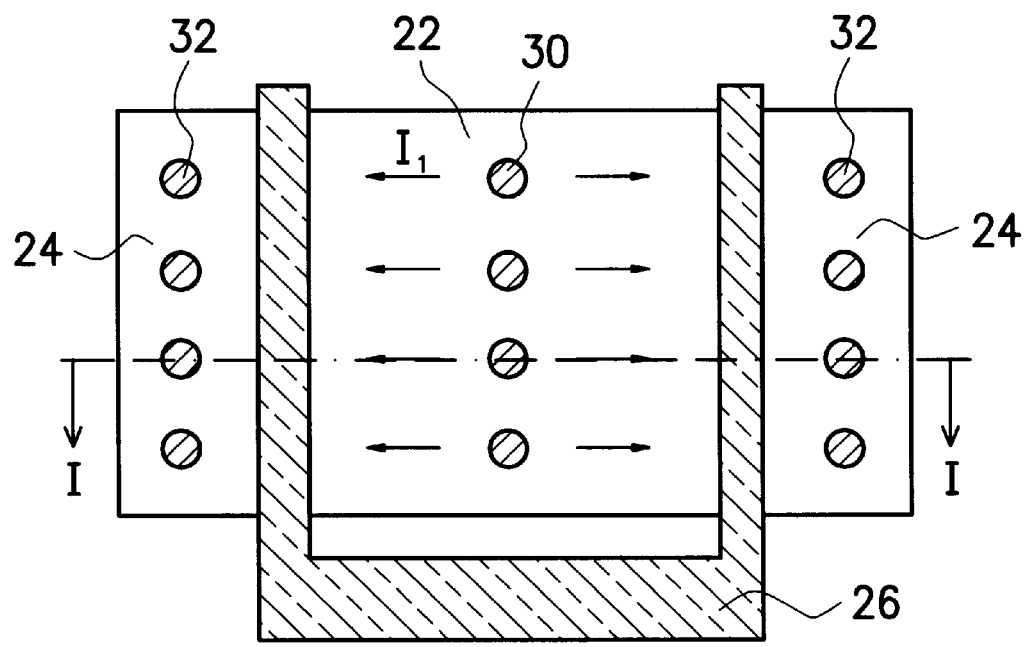
FIG. 3 is a schematic, top view of the ESD protective circuit in FIG. 2.

In the embodiment, the ESD protective circuit provided by the invention is compatible with the conventional circuit as shown in FIG. 1A or FIG. 1B. However, the internal structure of the ESD protective circuit provided by the invention is different from that of the conventional ESD protective circuit.

Figure 4:
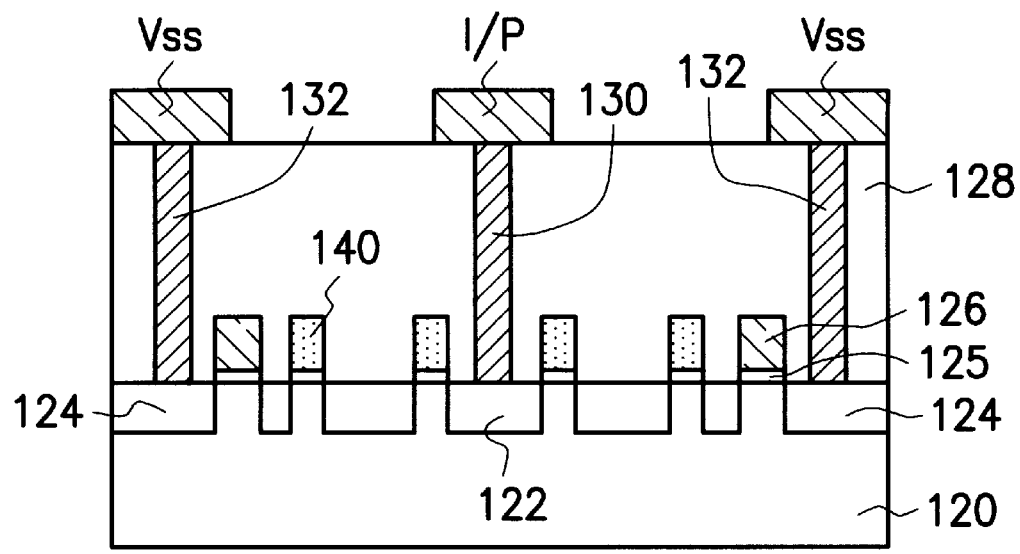
FIG. 4 is a schematic, cross-sectional view of an ESD protective circuit in a preferred embodiment according to the invention.

FIG. 4 is a schematic, cross-sectional view of an ESD protective circuit in a preferred embodiment according to the invention. As shown in FIG. 4, a transistor is formed on a substrate 120. The transistor comprises a drain region 122 formed in the substrate 120, a source region 124 formed in the substrate 120 and a gate electrode 126 formed on the substrate 120 between the source region 124 and the drain region 122. The gate electrode 126 is isolated from the substrate 120 by a gate oxide layer 125. The transistor further comprises several floating polysilicons 140 located on the substrate 120 between the drain contact 130 and the gate electrode 126. The floating polysilicons 140 are isolated from the substrate 120 by the gate oxide layer 125. The floating polysilicons 140 and the gate electrode 126 are formed at the same time, so that it is unnecessary to change the design of the ESD protective circuit and to use additional masks and process steps. Moreover, the shape of each floating polysilicon 140 can be a rectangular bar, for example. A dielectric layer 128 is formed over the substrate 120, and a drain contact 130 and a source contact 132 are formed in the dielectric layer 128. The drain region 122 is coupled to an input line I/P through the drain contact 130, and the input line I/P is coupled to an input port INP and the inner circuit 10 (as shown in FIG. 1A). The source region 124 is coupled to the ground $V_{SS}$ through the source contact 132.

Figure 5:
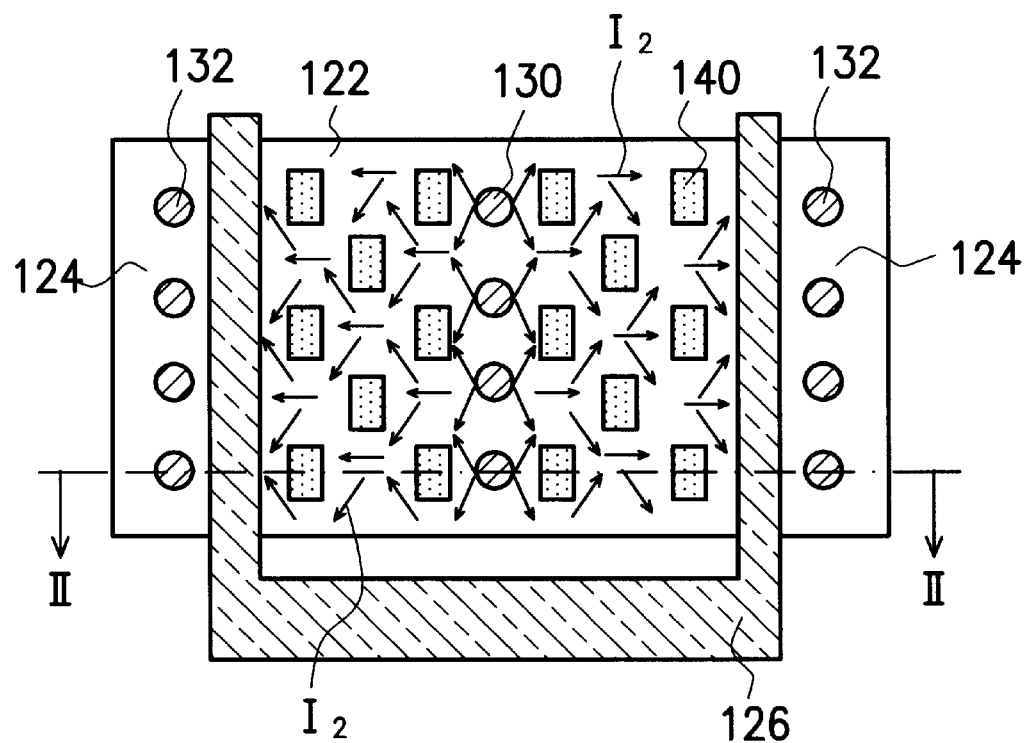
FIG. 5 is a schematic, top view of the ESD protective circuit in FIG. 4.

FIG. 5 is a schematic, top view of the ESD protective circuit in FIG. 4. The cross-sectional view taken along the line II—II in FIG. 5 is denoted as FIG. 4. As shown in FIG. 5, circles with declining lines at the midpoint part denote the source contacts 130 and circles with declining lines at both sides denote the drain contacts 132. The gate electrode 126 is between the source contacts 130 and the drain contact 132. The distance between the drain contact 130 and the gate electrode 126 is about 2–microcrometers. The source region 124 and the gate electrode 126 are respectively electrically coupled to a voltage line. The voltage line can be ground $V_{SS}$ (as shown in FIG.4), for example. The source region 122 is electrically coupled to the input line I/P (as shown in FIG. 1A or FIG. 1B). The floating polysilicons 140 are staggered on the substrate 120 in a checkered pattern between the drain contacts 130 and the gate electrode 126.

The ESD transient current $I_2$ (as shown in FIG. 5) flows to the drain region 122 through the drain contact 30 and diffuses in the drain region 122. Then, the ESD transient current $I_2$ flows to the voltage line through the source contact 132. Since the staggered floating polysilicons 140 disrupt the flow of the ESD transient current, the ESD transient current flows along the aperture between the floating polysilicons 140. Because the ESD transient current path is detoured, the electricity dissipation length is greatly increased. Therefore the ESD transient current can uniformly flow in the drain region 122 and does not focus at a portion of the drain region 122. Hence, the wafer structure cannot be easily damaged. Additionally, the efficacy of the ESD protective circuit is improved. Moreover, in the invention, the dissipation length can be greatly increased without increasing the circuit size and the cost, and additional masks are not needed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claim is:

1. A electrostatic discharge protective circuit formed on a substrate, comprising:

a gate electrode over the substrate;

a drain region in the substrate at one side of the gate electrode;

a source region in the substrate at the other side of the gate electrode;

a dielectric layer having a drain contact and a source contact formed therein over the substrate, wherein the drain contact is electrically coupled to the drain region and the source contact is electrically coupled to the source region; and a plurality of floating polysilicons on the substrate in the dielectric layer between the drain contact and the gate electrode.

2. The electrostatic discharge protective circuit of claim 1, wherein the shape of each floating polysilicon can be a rectangular bar.

3. The electrostatic discharge protective circuit of claim 1, wherein the gate electrode and the floating polysilicons are formed simultaneously.

4. A electrostatic discharge protective circuit formed on a substrate and coupled to an input port and an inner circuit, comprising:

a transistor having a drain region, a source region and a gate electrode on the substrate, wherein the drain region and the source region are at both sides of the gate electrode in the substrate;

a dielectric layer having a drain contact and a source contact formed therein over the substrate, wherein the drain region is electrically coupled to the input port and the inner circuit through the drain contact and the source region is electrically coupled to a voltage line through the source contact; and a plurality of floating polysilicons on the substrate in the dielectric layer between the drain contact and the gate electrode.

5. The electrostatic discharge protective circuit of claim 4, wherein the shape of each floating polysilicon can be a rectangular bar.

6. The electrostatic discharge protective circuit of claim 4, wherein the gate electrode and the floating polysilicons are formed simultaneously.

7. A electrostatic discharge protective circuit formed on a substrate and coupled to an input port and an inner circuit, comprising:

a transistor having a drain region, a source region and a gate electrode on the substrate, wherein the drain region and the source region are at both sides of the gate electrode in the substrate;

a drain contact, wherein the drain region is electrically coupled to the input port and the inner circuit through the drain contact;

a source contact, wherein the source region is electrically coupled to a voltage line through the source contact; and a plurality of floating polysilicons staggered on the substrate in a checkered pattern between the drain contact and the gate electrode.

8. An electrostatic discharge protective circuit formed on a substrate, comprising:

a gate electrode over the substrate;

a drain region in the substrate at one side of the gate electrode;

a source region in the substrate at the other side of the gate electrode;

a dielectric layer having a drain contact and a source contact formed therein over the substrate, wherein the drain contact is electrically coupled to the drain region and the source contact is electrically coupled to the source region; and a plurality of floating polysilicons on the substrate in the dielectric layer between the drain contact and the gate electrode, wherein the floating polysilicons are staggered on the substrate in a checkered pattern.

9. The electrostatic discharge protective circuit of claim 8, wherein the shape of each floating polysilicon is a rectangular bar.

10. The electrostatic discharge protective circuit of claim 8, wherein the gate electrode and the floating polysilicons are formed simultaneously.

11. An electrostatic discharge protective circuit formed on a substrate and coupled to an input port and an inner circuit, comprising:

a transistor having a drain region, a source region and a gate electrode on the substrate, wherein the drain region and the source region are at both sides of the gate electrode in the substrate;

a dielectric layer having a drain contact and a source contact formed therein over the substrate, wherein the drain region is electrically coupled to the input port and the inner circuit through the drain contact and the source region is electrically coupled to a voltage line through the source contact; and a plurality of floating polysilicons on the substrate in the dielectric layer between the drain contact and the gate electrode, wherein the floating polysilicons are staggered on the substrate in a checkered pattern.

12. The electrostatic discharge protective circuit of claim 11, wherein the shape of each floating polysilicon is a rectangular bar.

13. The electrostatic discharge protective circuit of claim 11, wherein the gate electrode and the floating polysilicons are formed simultaneously.

* * * * *